(12) United States Patent
Chao et al.

(10) Patent No.: US 6,405,357 B1
(45) Date of Patent: Jun. 11, 2002

(54) METHOD FOR POSITIONING BOND PADS IN A SEMICONDUCTOR DIE

(75) Inventors: Te Tsung Chao; Hui Chin Fang, both of Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 09/562,904

(22) Filed: May 2, 2000

(51) Int. Cl.[7] .................. G06F 17/50; G06F 19/00; H01L 21/44; H01L 29/40; H01L 23/495
(52) U.S. Cl. .................. 716/10; 716/14; 700/186; 700/114; 700/96; 700/97; 700/121; 700/182; 438/599; 438/614; 257/676; 257/777; 257/784; 257/786
(58) Field of Search .................. 716/1–21; 700/95–97, 700/114, 117–121, 182, 186–193; 257/676, 777–784, 786; 438/599, 612–617

(56) References Cited

U.S. PATENT DOCUMENTS

| | | | |
|---|---|---|---|
| 5,498,767 A | * 3/1996 | Huddleston et al. | 716/12 |
| 5,801,450 A | * 9/1998 | Barrow | 257/784 |
| 5,962,926 A | * 10/1999 | Torres et al. | 257/784 |
| 6,110,823 A | * 8/2000 | Eldridge et al. | 438/660 |
| 6,150,727 A | * 11/2000 | Takagi | 257/786 |

FOREIGN PATENT DOCUMENTS

| | | | | |
|---|---|---|---|---|
| EP | 0430039 A2 | * 6/1991 | | B41J/2/345 |
| EP | 0588481 A1 | * 3/1994 | | H01L/23/495 |
| EP | 0604782 A1 | * 7/1994 | | H01L/21/00 |
| JP | 360035524 A | * 2/1985 | | H01L/21/60 |
| JP | 361159758 A | * 7/1986 | | H01L/25/04 |
| JP | 362001238 A | * 1/1987 | | H01L/21/60 |
| JP | 362185331 A | * 8/1987 | | H01L/21/60 |
| JP | 402142150 A | * 5/1990 | | H01L/21/60 |
| JP | 404024928 A | * 1/1992 | | H01L/21/52 |
| JP | 405259380 A | * 10/1993 | | H01L/27/04 |
| JP | 411163033 A | * 6/1999 | | H01L/21/60 |

* cited by examiner

Primary Examiner—Matthew Smith
Assistant Examiner—Phallaka Kik

(57) ABSTRACT

A method for positioning bond pads in a semiconductor die comprises the steps of (I) setting parameters including (a) setting a baseline pad pitch to a first value, (b) setting a first pad position equal to a first pad value and (c) providing a focal point; (II) determining a first angle between a first line through a center of the first pad position and the focal point and a second line through a center of the semiconductor die and normal to the edge; (III) determining a first pad spacing increment value equal to the first value divided by a cosine of the first angle; (IV) setting a second pad position equal to a second pad value, wherein the second pad value at least equals the first pad value plus the first value if both of the first bond pad and the second bond pad are ground pad or power pad with the same potential, else the second pad value at least equals the first pad value plus the first pad spacing increment value; and (V) using the first and second pad values to respectively position a first bond pad and a second bond pad along the edge of the semiconductor die. Beginning from the bond pad closest to the die corner, optimized positions of bond pads can be determined by repeating steps I to V.

2 Claims, 3 Drawing Sheets

METHOD FOR POSITIONING BOND PADS IN A SEMICONDUCTOR DIE

BACKGROUND OF THE INVENTION

1. Field of the Invention

This invention relates to a method for designing a semiconductor die and, more particularly, to a method for determining positions of bond pads of the semiconductor die.

2. Description of the Related Art

One stage of integrated circuit design involves determining where bond pads are to be located on the die or chip. The placement of bond pads is not a trivial design task. For example, capabilities of manufacturing processes must be taken into account. When a die is designed to use wire bonding (as opposed to tape automated bonding or flip chip bonding), the placement of bond pads is of critical importance.

Several techniques exist for determining appropriate positions for bond pads in dies which are to be wire bonded around the die periphery. One of the simplest and most prevalent techniques is to simply divide the available perimeter of the semiconductor die by the required number of bond pads. The result is a bond pad configuration having a constant pad pitch (where pitch is the distance from the center of one bond pad to the center of an immediately adjacent pad) around the entire die periphery. A problem with this method is that the "wire pitch" (the actual pitch between immediately adjacent bonding wires) is not constant around the die periphery, unless all the wires are parallel. Instead, the wire pitch decreases as the die corners are approached because the contact pads (such as inner lead portions of a lead frame or fingers of a substrate) to which the bonding wires are eventually bonded are at a larger pitch than the bond pads. This effect is illustrated in FIG. 1. In FIG. 1, P equals the constant bond pad pitch and P' equals the wire pitch. As bonding wires 10 approach corners of a semiconductor die 12, an angle θ increases due to an increasing pitch of fingers 14. As a result, the wire pitch (P') is gradually reduced according to the equation: $P'_x = P * \cos(\theta_x)$. The wire pitch is an important parameter because this distance effects the ability of a wire bonding tool to make bonds without the capillary of the tool disturbing previously made wire bonds. Use of constant pitch bond pad layout may not lead to a layout suitable for manufacturing if the wire pitch becomes too small.

A prior art improvement over the traditional single row of bond pads having constant pad pitches is the use of constant wire pitches as taught in U.S. Pat. No. 5,498,767. A constant wire pitch device maintains a constant wire pitch, while the pad pitch between adjacent pads varies, thereby allowing a wire bonding tool to make bonds without the capillary of the tool disturbing previously made wire bonds. A constant wire pitch semiconductor die characterizes in that the pad pitch is diminished from a maximum at the corners to a minimum at the die centerlines. However, a problem with the method taught in U.S. Pat. No. 5,498,767 is that it fails to consider effect of capillary tool and error in wire bonding process. Further, the minimum wire pitch required for bond pads with different functions differ from one another.

Accordingly, the present invention seeks to provide a method for determining positions of bond pads of a semiconductor die which overcomes, or at least reduces the abovementioned problems of the prior art.

SUMMARY OF THE INVENTION

It is a primary object of the present invention to provide a method for positioning bond pads in a semiconductor die using function orientation pad pitch to significantly reduce unnecessary pad spacing such that smaller die sizes are achievable.

It is another object of the present invention to provide a method for positioning bond pads in a semiconductor die which further takes into account effect of capillary tool and errors in wire bonding process which may be imposed upon bond pad placement, thereby making the operation of wire bonding more suitable for manufacturing.

The method according to a preferred embodiment of the present invention for positioning bond pads along an edge of a semiconductor die from a die corner comprises the steps of (I) setting parameters including (a) setting a baseline pad pitch to a first value, (b) setting a first pad position equal to a first pad value and (c) providing a focal point (in the present invention, the wire directions are assumed to be parallel to the lines that the pad centers form with an optimized focal point; the wires at the die corners are assumed to be approximately in line with the direction of the die diagonals); (II) determining a first angle between a first line through a center of the first pad position and the focal point and a second line through a center of the semiconductor die and normal to the edge; (III) determining a first pad spacing increment value equal to the first value divided by a cosine of the first angle; (IV) setting a second pad position equal to a second pad value, wherein the second pad value at least equals the first pad value plus the first value if both of the first bond pad and the second bond pad are ground pad or power pad with the same potential, else the second pad value at least equals the first pad value plus the first pad spacing increment value; and (V) using the first and second pad values to respectively position a first bond pad and a second bond pad along the edge of the semiconductor die. Beginning from the bond pad closest to the die corner, optimized positions of bond pads can be determined by repeating steps I to V. When two adjacent bond pads are both ground pad or power pad with the same potential, the pad pitch between them can be always set as the baseline pad pitch even they are positioned approaching to the die corner. This is because there is nearly no influence even two ground wires (or power wires) get short circuit. Therefore, the present invention significantly reduce unnecessary pad spacing such that smaller die sizes are achievable.

The method for positioning bond pads in accordance with the present invention may further consider the effect of capillary tool and manufacturing error imposed upon bond pad placement. At this time, the step of setting parameters further includes (d) setting an effective radius of capillary tool to a second value, and (e) setting an overall estimated error of wire bonding to a third pad value. They can be used to determine a fourth value equal to the second value plus the third value, and then determine a second pad spacing increment value equal to the fourth value divided by a cosine of the first angle. If the wire bonding of the second bond pad is designed to be conducted before the wire bonding of the first bond pad, the second pad value must at least equal the first pad value plus the second pad spacing increment value. Accordingly, by further considering the effect of capillary tool and manufacturing error as described above, the method of present invention significantly reduce the occurrence of the problem that capillary tool interferes or contacts previously made wire bonds.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 2:
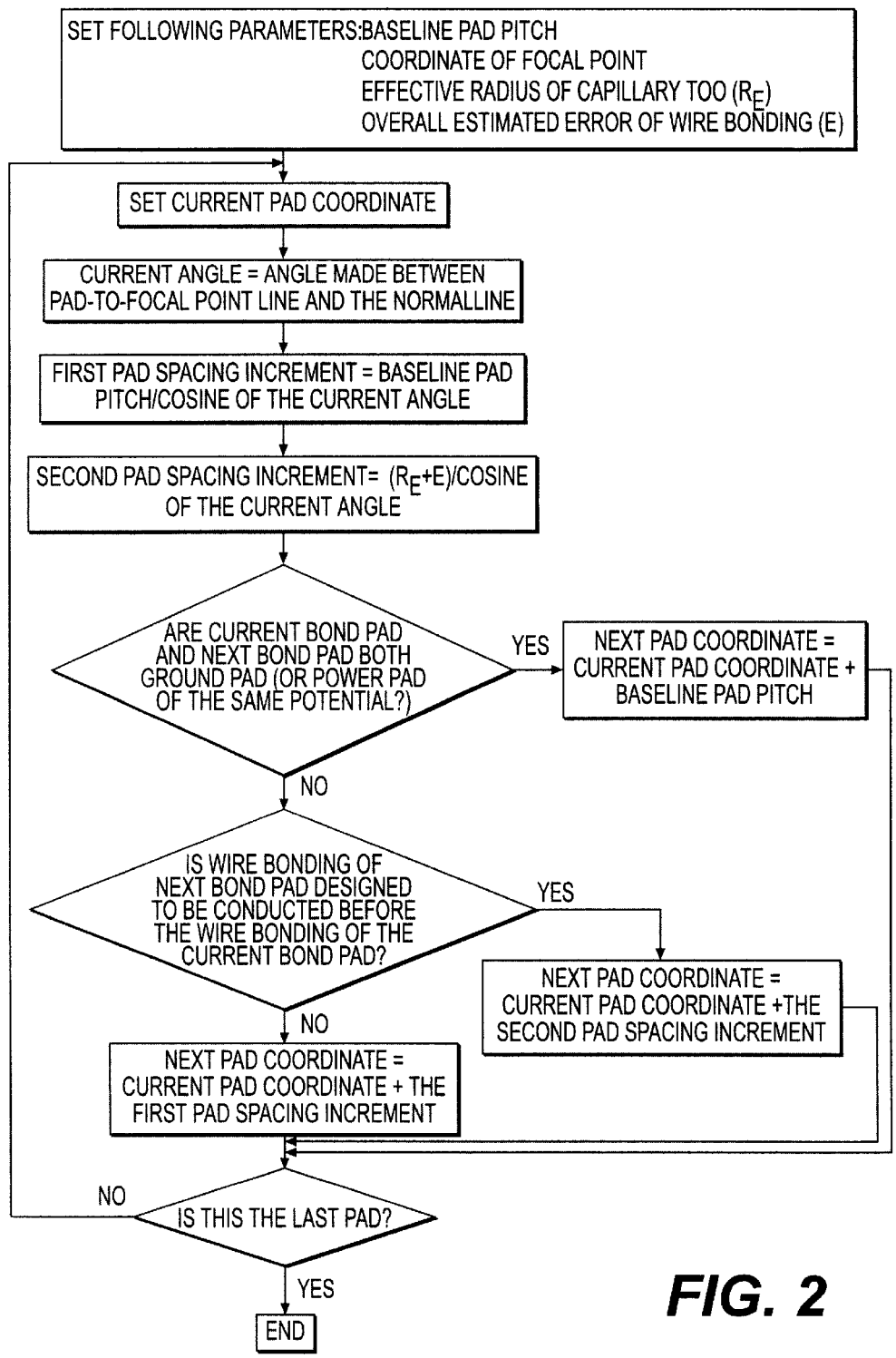
FIG. 2 is a flow chart outlining a method in accordance with the present invention for determining and positioning bond pads on a semiconductor die.

FIG. 2 is a flow chart outlining steps for positioning bond pads on a semiconductor die in accordance with the present invention. While the procedure outlined in FIG. 2 is quite detailed, it is noted that not all of these steps are required in practicing the present invention.

Figure 1:
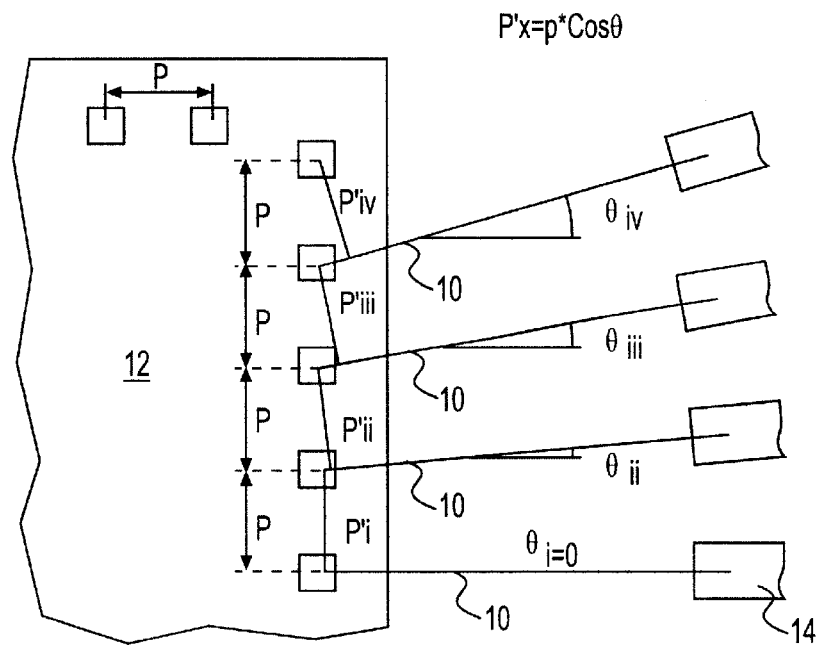
FIG. 1 depicts a corner portion of a wire-bonded semiconductor die and a prior art method for determining bond pad positions on the die.
Figure 3:
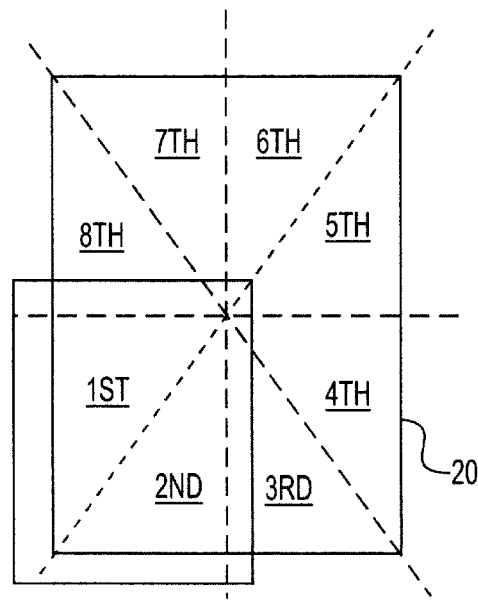
FIGS. 3–5 illustrate a semiconductor die or a portion thereof, and are used to explain the method in accordance with the present invention.

In bond pad layout, designers typically work in octants to take advantage of the symmetry of the die. As illustrated in FIG. 3, a semiconductor die 20 can be segmented into eight octants, all of which are identical in physical dimensions, differing only in orientation. If the bond pads along four sides of the die have the same functional arrangement, by determining the bond pad positions in one octant, the bond pad positions for at least three other octants can be determined mathematically by a mirroring the pad coordinates of the first octant. Further, if the die is perfectly square, bond pads from one octant can be mirrored in all of the remaining seven remaining octants. However, if four sides of the die have different pad number or arrangement, the bond pad positions of each side must be determined independently.

Referring to FIG. 2, a first step is a setting step wherein a number of parameters are set.

A first input parameter is a "baseline pad pitch," which is initially set to equal the available perimeter around the die divided by the total number of bond pads to be positioned around the die.

Figure 4:
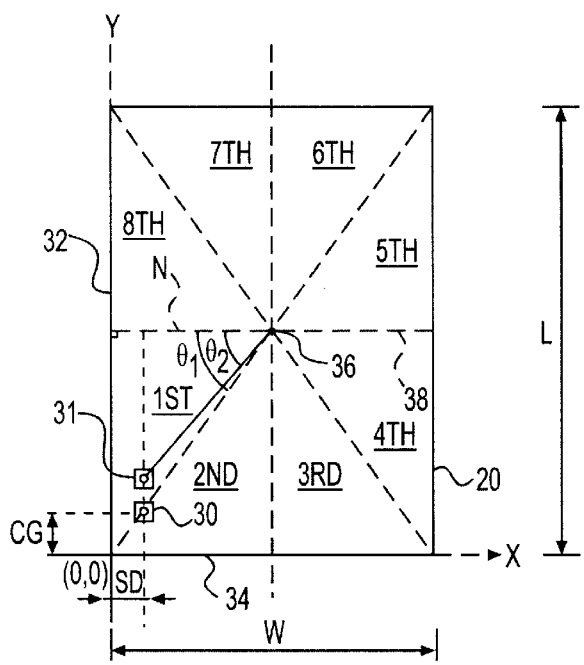

A second input parameter is the coordinate of a "Focal Point." In the present invention, the wire directions are assumed to be parallel to the lines that the pad centers form with an optimized focal point; the wires at the die corners are assumed to be approximately in line with the direction of the die diagonals. Therefore, the focal point 36 may be set at the die center, i.e., at the intersection of the 45° lines from the die corners (see FIG. 4). In the present invention, the die width is referred to as "W" and the die length is referred to as "L". For purposes of this discussion, W will be the measured distance of the die's shortest side and L will be the measured distance of the die's longest side. As depicted in FIG. 4, the focal point 36 has a coordinate (W/2, L/2).

A third input parameter is an "effective radius of capillary tool," which is estimated by the following formula: RE=TIP/2+LH*tangent(BTNK Angle/2), wherein RE is defined as the effective radius of capillary tool, TIP is defined as the tip diameter of the selected capillary tool, and BTNK Angle is defined as the tapered cone angle of the selected capillary tool, and LH is defined as loop height (typically between 3–8 mils). In a embodiment, TIP of the selected capillary tool is 62 µm, BTNK Angle is 10▢, and LH is set to a middle value 6 mils (about 152 µm). Then, the RE calculated from the formula given above is about 44.3 µm.

A fourth input parameter is an "overall estimated error of wire bonding," which is typically estimated from the error of capillary dimension, bonding error from machine, and error from manual teaching. Error of current wire bonder is typically between 4–7 µm. In this invention, the overall estimated error of wire bonding is estimated as 7 µm.

The second step of the method for positioning bond pads of the present invention is to set current pad coordinate ($X_C$, $Y_C$). The method of the present invention starts calculation from the Furthest Allowable Pad which is the closest pad position to the corner of the die. Therefore, the coordinate of the Furthest Allowable Pad should be determined first, then set as the current pad coordinate. Turning now to FIG. 4, it helps to understand how to determine the coordinate of the Furthest Allowable Pad. Typically, bond pads located along the die edge 32 keeps a "Street Distance (SD)" from the die edge 32. The Furthest Allowable Pad 30 keeps a" Corner Gap (CG)" from the die edge 34 which is normal to the edge 32. The Street Distance is usually determined from manufacturing limitations imposed by assembly operations, such as sawing or dicing the die from a wafer. The Corner Gap is typically larger than the Street Distance to avoid interference between the cornermost pad along one edge and the cornermost pad along an adjacent edge. Accordingly, the Furthest Allowable Pad 30 has a coordinate (SD, CG). Note that for the purpose of positioning pads in the 1st octant, the x-coordinate for all the pads will be the same, i.e., SD. Accordingly, only the y-coordinates are subsequently discussed.

The third step of the method in accordance with the present invention is to calculate a "Wire Angle θ." In the 1st octant, the Wire Angle is the angle between a line drawn between the current pad and the focal point 36 and the normal line to the edge 32. The normal line to the edge 32 can be defined as the line N through a center of the die and normal to the edge 32. Mathematically, the Wire Angle θ may be calculated from the formula: θ=arc tangent[(L/2−$Y_C$)/(W/2−$X_C$)]. Therefore, Current Angle $θ_1$=arc tangent [(L/2−CG)/(W/2−SD)].

Figure 5:
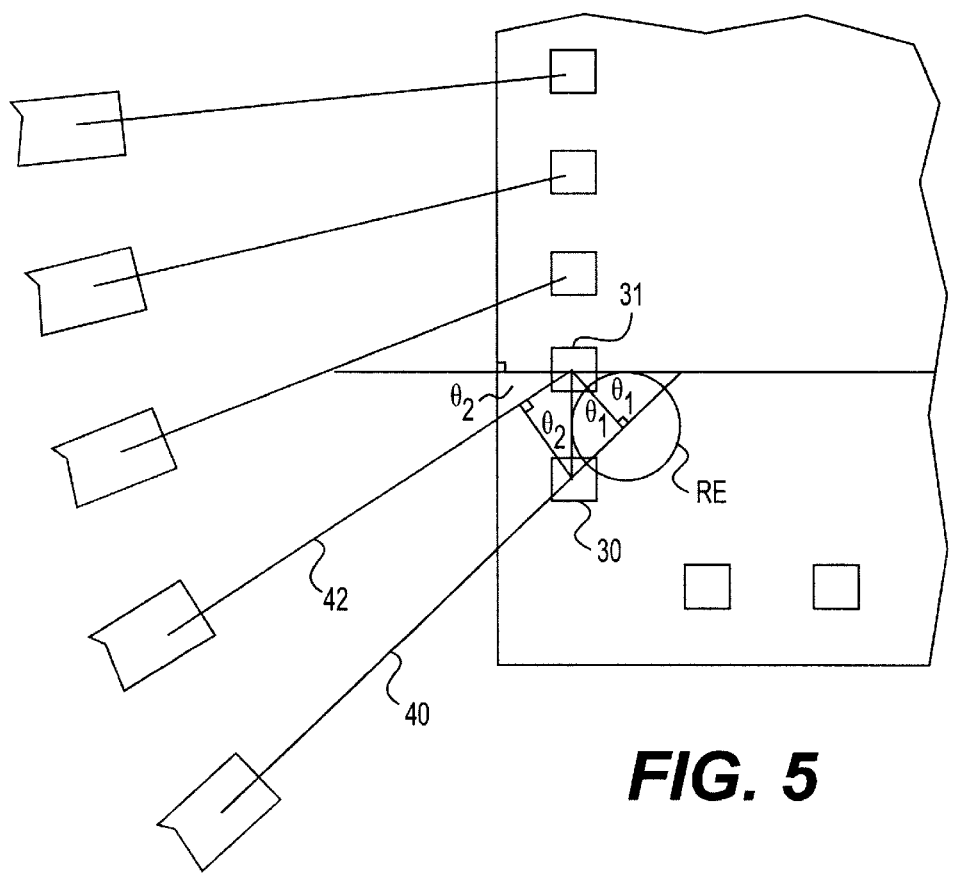

Referring to FIG. 5, the wire pitch between bonding wires 40, 42 should be at least the baseline pad pitch (BPP) to avoid short circuiting if no wire is connected to the bond pad 31 when the wire bonding of the bond pad 30 is conducted. Accordingly, if the pitch between the bond pads 30, 31 is referred to as $X_1$, then the wire pitch therebetween will be $X_1$*cosine($θ_2$). Then, the pitch between the bond pads 30, 31 can be estimated from the formula: $X_1 \geq$ BPP/cosine($θ_2$). However, the present invention use BPP/cosine($θ_1$) instead of the minimum value of $X_1$ to estimate the pitch between the bond pads 30, 31.

If wire 42 is already bonded to the bond pad 31 when the wire bonding of the bond pad 30 is conducted, effect of capillary tool should be taken into account, i.e., the difference between the reverse wire pitch (which will be described in more detail below) and the effective radius of capillary tool (RE) should not be less than the overall estimated error of wire bonding (E). Accordingly, if the pitch between the bond pads 30, 31 is referred to as $X_2$, then the reverse wire pitch therebetween will be $X_2$*cosine($θ_1$). Then, the pitch between the bond pads 30, 31 can be estimated from the formula: $X_2 \geq$ (RE+E)/cosine($θ_1$). At this time, the minimum value of $X_2$ is referred to as the second pad spacing increment value.

The fourth step of the method in accordance with the present invention is to calculate a "first pad spacing increment value" equal to the baseline pad pitch divided by a cosine of the current angle.

The fifth step of the method in accordance with the present invention is to calculate a "second pad spacing increment value" equal to the effective radius of capillary tool plus the overall estimated error of wire bonding, then divided by a cosine of the current angle.

The sixth step of the method in accordance with the present invention is to determine whether or not both of the current bond pad and the next bond pad are ground pad or power pad with the same potential. If both of the current bond pad and the next bond pad is designed to be ground pad (or power pad with the same potential), then next pad coordinate equals the current pad coordinate plus the baseline pad pitch. If not both of the current bond pad and the next bond pad is designed to be ground pad (or power pad with the same potential), then the process continues on to the seventh step which will be described in more detail below. Generally speaking, when two adjacent bond pads are both ground pad or power pad with the same potential, the pad pitch therebetween can be set as the baseline pad pitch even they are positioned approaching to the die corner. This is because there is nearly no influence even two ground wires (or power wires) with the same function get short circuit. However, when two adjacent bond pads are designed as power pads for supplying different source voltage, it is essential to avoid short circuit between wires bonded thereto. Therefore, pitch between two adjacent power pads with different potential should be determined by following steps described below.

The seventh step of the method in accordance with the present invention is to determine whether or not the wire bonding of the next bond pad is designed to be conducted before the wire bonding of the current bond pad. If the wire bonding of the next bond pad is conducted before that of the current bond pad, then the next pad coordinate equals the current pad coordinate plus the second pad spacing increment. If no wire is connected to the next bond pad when the wire bonding of the current bond pad is conducted, then the next pad coordinate equals the current pad coordinate plus the first pad spacing increment. Typically, lowest tier ground wires is bonded first, then the power wires, and finally the finger wires (which are used to connect bond pads with fingers of a substrate).

The eighth step of the method in accordance with the present invention is to determine whether or not the current pad is the last pad. If not, the steps 2 to 8 are repeated for the third bond pad, fourth bond pad, etc., up to the last pad of the 1st octant.

The method for positioning bond pads of the present invention further takes into account effect of capillary tool and error in wire bonding process, thereby significantly reducing the occurrence of the problem that capillary tool interferes or contacts previously made wire bonds.

Although the invention has been explained in relation to its preferred embodiment, it is to be understood that many other possible modifications and variations can be made without departing from the spirit and scope of the invention as hereinafter claimed.

What is claimed is:

1. A method for positioning bond pads along an edge of a semiconductor die from a die corner, the method comprising the steps of:

setting a baseline pad pitch to a first value;

setting a first pad position equal to a first pad value;

providing a focal point;

determining a first angle between a first line through a center of the first pad position and the focal point and a second line through a center of the semiconductor die and normal to the edge;

determining a first pad spacing increment value equal to the first value divided by a cosine of the first angle;

setting a second pad position equal to a second pad value, wherein the second pad value at least equals the first pad value plus the first value if both of a first bond pad and a second bond pad are ground pads or power pads with the same potential, else the second pad value at least equals the first pad value plus the first pad spacing increment value; and using the first and second pad values to respectively position a first bond pad and a second bond pad along the edge of the semiconductor die.

2. The method as claimed in claim 1, further comprising the steps of:

setting an effective radius of capillary tool to a second value;

setting an overall estimated error of wire bonding to a third pad value;

determining a fourth value equal to the second value plus the third pad value; and determining a second pad spacing increment value equal to the fourth value divided by a cosine of the first angle, wherein the second pad value at least equals the first pad value plus the second pad spacing increment value if the wire bonding of the second bond pad is designed to be conducted before the wire bonding of the first bond pad.

\* \* \* \* \*